(12) United States Patent
Pratt

(10) Patent No.: US 7,952,171 B2
(45) Date of Patent: May 31, 2011

(54) DIE STACKING WITH AN ANNULAR VIA HAVING A RECESSED SOCKET

(75) Inventor: Dave Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/905,708

(22) Filed: Oct. 15, 2010

(65) Prior Publication Data

US 2011/0031632 A1 Feb. 10, 2011

Related U.S. Application Data

(62) Division of application No. 12/107,576, filed on Apr. 22, 2008, now Pat. No. 7,821,107.

(51) Int. Cl.
*H01L 29/40* (2006.01)

(52) U.S. Cl. ........ 257/621; 257/698; 257/774; 257/777; 257/778; 257/E23.011; 438/667; 438/459

(58) Field of Classification Search .................. 257/621, 257/698, 774, 777, 778, E23.011; 438/667, 438/459

See application file for complete search history.

(56) References Cited

U.S. PATENT DOCUMENTS

| | | | |
|---|---|---|---|
| 5,618,752 A | 4/1997 | Gaul | |
| 5,627,106 A * | 5/1997 | Hsu | ............................. 438/459 |
| 5,682,062 A | 10/1997 | Gaul | |
| 6,051,887 A | 4/2000 | Hubbard | |
| 6,492,726 B1 | 12/2002 | Quek et al. | |
| 6,577,013 B1 | 6/2003 | Glenn et al. | |
| 7,030,632 B2 | 4/2006 | Watkins et al. | |
| 7,078,790 B2 | 7/2006 | Haba | |
| 7,118,389 B2 | 10/2006 | Fork et al. | |
| 7,173,325 B2 | 2/2007 | Vasoya et al. | |
| 7,183,648 B2 | 2/2007 | Ramanathan et al. | |
| 7,217,597 B2 | 5/2007 | Akram | |
| 7,250,675 B2 | 7/2007 | Fasano et al. | |
| 7,282,932 B2 | 10/2007 | Kirby et al. | |
| 7,821,107 B2 | 10/2010 | Pratt | |
| 2002/0127771 A1 | 9/2002 | Akram et al. | |
| 2003/0057539 A1 | 3/2003 | Koopmans | |
| 2004/0021230 A1 | 2/2004 | Tsai et al. | |
| 2004/0157373 A1 | 8/2004 | Cobbley et al. | |
| 2006/0273455 A1 | 12/2006 | Williams et al. | |
| 2006/0278979 A1 | 12/2006 | Rangel | |
| 2007/0085198 A1 | 4/2007 | Shi et al. | |
| 2007/0099341 A1 | 5/2007 | Lo | |
| 2007/0182020 A1 | 8/2007 | Trezza et al. | |
| 2007/0196948 A1 | 8/2007 | Trezza | |
| 2007/0278648 A1 | 12/2007 | Akram | |
| 2008/0017971 A1 | 1/2008 | Hollis | |

(Continued)

FOREIGN PATENT DOCUMENTS

WO WO-2004059720 A1 7/2004

(Continued)

*Primary Examiner* — Tu-Tu V Ho

(74) *Attorney, Agent, or Firm* — Schwegman, Lundberg & Woessner, P.A.

(57) ABSTRACT

A die stack including a die having an annular via with a recessed conductive socket and methods of forming the die stack provide a structure for use in a variety of electronic systems. In an embodiment, a die stack includes a conductive pillar on the top of a die inserted into the recessed conductive socket of another die.

14 Claims, 10 Drawing Sheets

U.S. PATENT DOCUMENTS

2008/0050859 A1 2/2008 Wallace
2008/0055957 A1 3/2008 Zhang
2008/0070346 A1 3/2008 Lin et al.
2008/0079150 A1 4/2008 Simon et al.
2009/0261457 A1 10/2009 Pratt

FOREIGN PATENT DOCUMENTS

| WO | WO-2005122706 | 12/2005 |
| WO | WO-2007070065 | 6/2007 |
| WO | WO-2009131671 A2 | 10/2009 |

* cited by examiner

DIE STACKING WITH AN ANNULAR VIA HAVING A RECESSED SOCKET

This application is a divisional of U.S. patent application Ser. No. 12/107,576, filed on Apr. 22, 2008 now U.S. Pat. No. 7,821,107, which is incorporated herein by reference in its entirety.

TECHNICAL FIELD

Example embodiments relate generally to the technical field of integrated circuit manufacture of electronic devices and systems.

BACKGROUND

As the focus in microelectronics is gradually changing to include more emphasis on packaging, added values may be attained in packages by using System-in-Packages (SiP) methods. SiP methods may be considered as the leading viable solution for the ongoing trend in function integration. SiP methods include placing several dies into one package, either side-by-side or on top of each other. However, the miniaturization trend may, more or less, reduce the use of dies side-by-side. Therefore, additional approaches may enhance the trend to minimize die real estate, while providing high speed and reliable interfaces

BRIEF DESCRIPTION OF THE DRAWINGS

Some embodiments are illustrated by way of example and not limitation in the figures of the accompanying drawings in which.

DETAILED DESCRIPTION

Embodiments of example structures and methods for die stacking by way of annular via with recessed conductive socket and formed conductive pillar will be described. In the following description, for purposes of explanation, numerous examples having example-specific details are set forth to provide a thorough understanding of example embodiments. It will be evident, however, to one skilled in the art that the present examples may be practiced without these example-specific details.

Example embodiments may include forming a conductive annular TSV (in the art, TSV is an acronym for through silicon via, hereinafter it is will be used to represent through substrate via) configured to have a recessed portion surrounded by inner walls of the annular via on a bottom surface of a substrate. The method may include forming a conductive layer to cover and line the recessed portion of the annular via to form a recessed conductive socket. The method may further include forming a conductive cylindrical pillar extending out of a planar end portion of the annular via (e.g., on the top of a bond pad structure on the front side of an adjacent stacked die)

Figure 1:
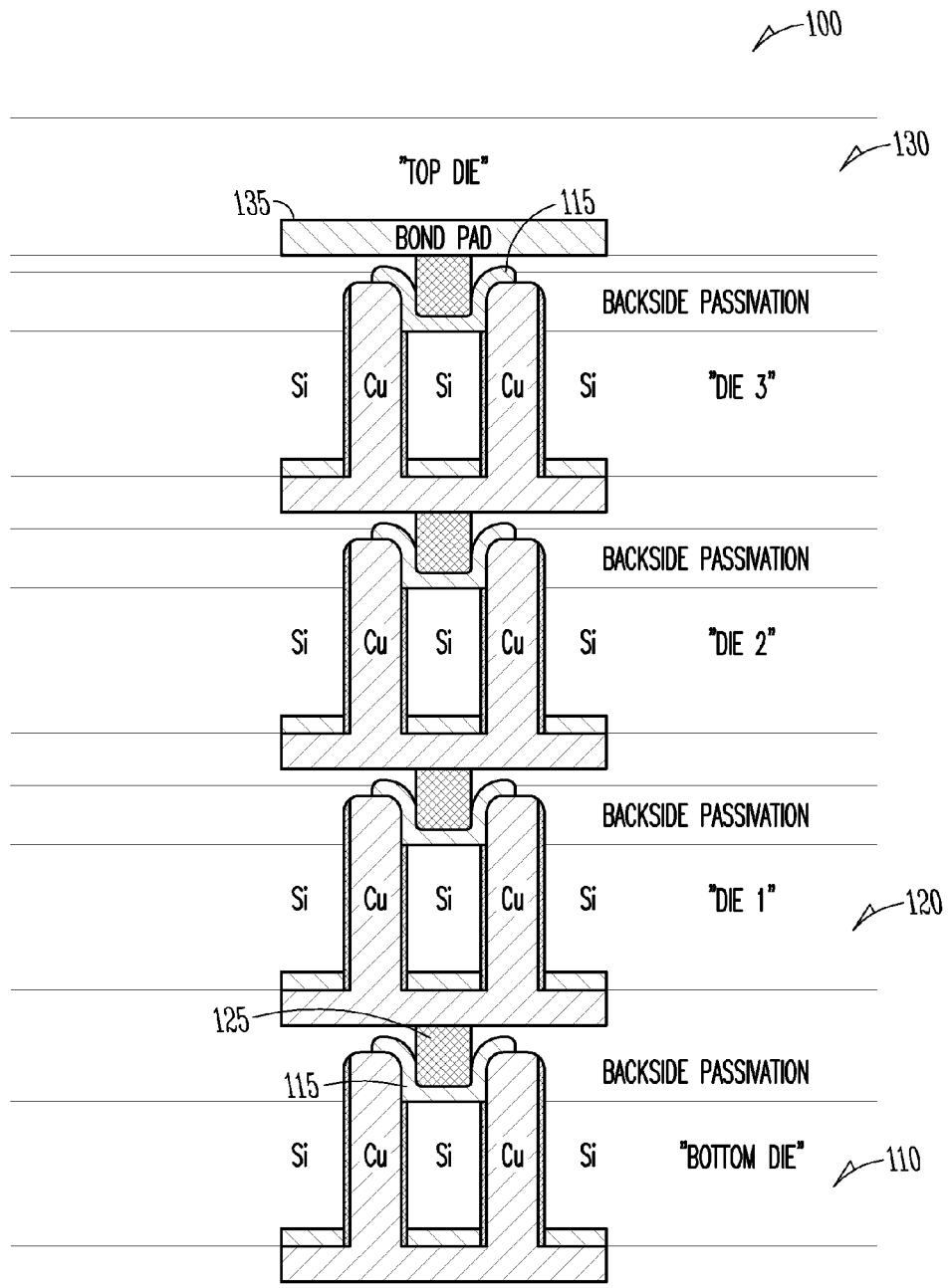
FIG. 1 is a cross sectional view illustrating an example embodiment of a portion of a stack of dies connected by using annular vias with recessed conductive sockets and conductive pillars.

FIG. 1 is a cross sectional view illustrating an example embodiment of a portion of a stack 100 of dies connected by using annular vias with recessed conductive sockets and conductive pillars. The stack 100 may include a bottom die 110 including a conductive recessed socket 115, one or more middle dies 120 including a conductive recessed socket 115 as well as a conductive pillar 125, and a top die 130 that includes a conductive pillar 125 formed on a bond pad 135. The conductive pillar 125 and the conductive recessed socket 115 may be configured to match in size and be able to fit together to form a stable conductive coupling between adjacent dies (e.g., the bottom die 110 and the middle die 120, the middle dies 120 with each other, or the middle die 120 and the top die 130). In an example embodiment, the stack may consist of the bottom die 110 and the top die 130.

In some example embodiments, the dies 110, 120, or 130 may include semiconductor wafers. The semiconductor wafers may include, but not limited to, silicon. The dies may also include electronic devices, e.g., DRAM, SDRAM, PCRAM, Flash memory, imagers, etc. The conductive pillar may be fabricated from copper and the conductive recessed socket may be made from an under bump material (UBM), e.g., a Nickel/Palladium/Gold Alloy. Other conductive materials may also be used for fabrication of either of the conductive pillar or the conductive recessed socket.

The die stacking method presented in this application provides a number of advantages over the existing art. For example, the conductive recessed socket 115 and the conductive pillar 125 may provide an interlocking feature that may enhance alignment stability as stacked dies are moved from the die stacking process to subsequent processes (e.g., reflow, under-fill, etc.). Another advantage of the method may include achieving near zero bond-line die stacking made possible by the recessed socket 115 and the conductive pillar 125.

Figure 2:
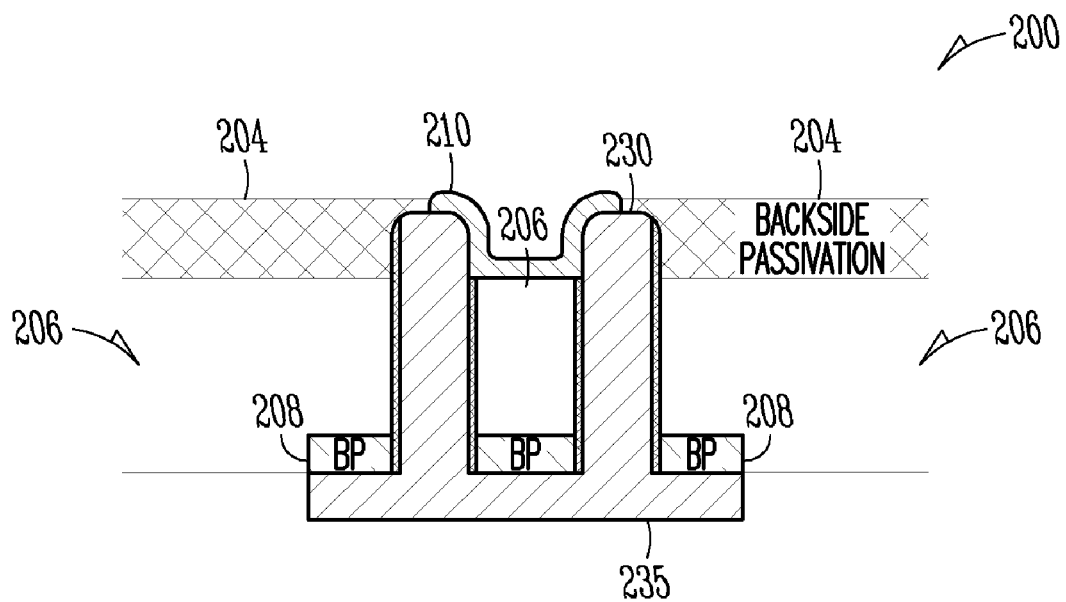
FIG. 2 is a cross sectional view illustrating an example embodiment of a portion of a bottom die including an annular via with recessed conductive socket.

FIG. 2 is a cross-sectional view illustrating an example embodiment of a portion 200 of a bottom die including an annular via with recessed conductive socket 210. The portion 200 may be a part of the bottom die 110 of FIG. 1. The portion 200 may include a substrate 206 (e.g., a silicon wafer), a conductive annular TSV 230, and a recessed conductive, e.g., UBM, layer 210 forming an UBM socket. In example embodiments, the portion 200 may also include a backside passivation 204, and a bond pad 208. The UBM socket may be formed by the inner walls of the annular via on a bottom surface of the substrate 206. The annular TSV 230 may include a planar end portion 235. The annular TSV 230 and the planar end portion 235 may include copper. The top surface of the substrate may be an active surface (including integrated electronic devices) of the bottom die 110.

Figure 3:
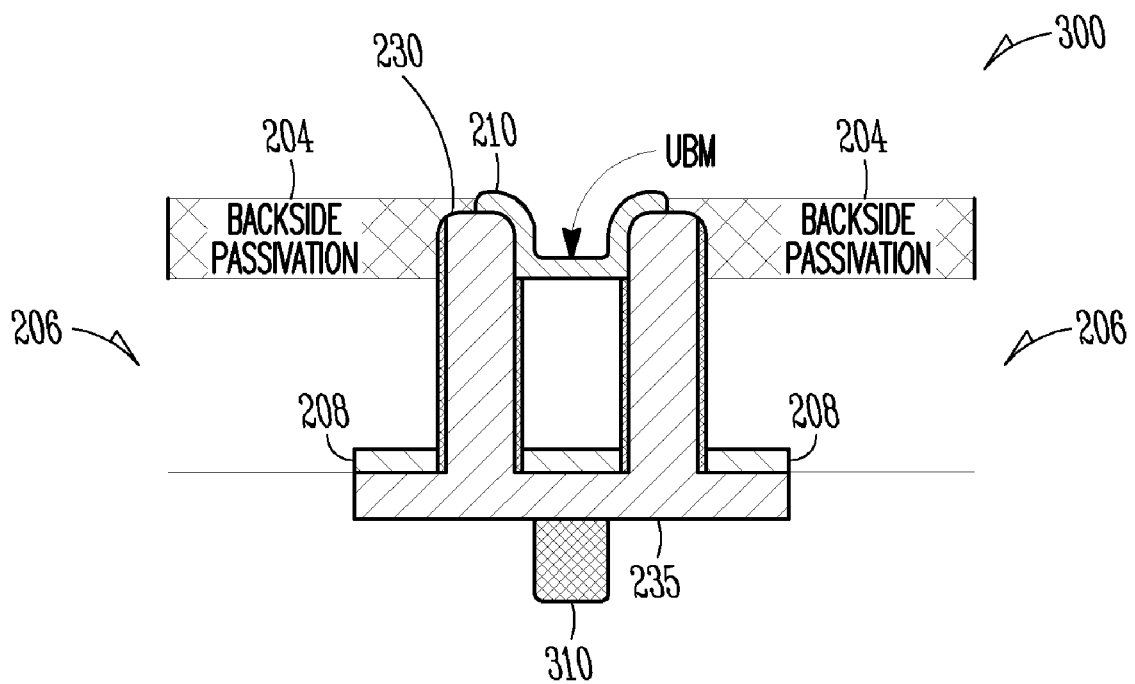
FIG. 3 is a cross sectional view illustrating an example embodiment of a portion of a middle die including an annular via with recessed conductive socket and a conductive pillar.

FIG. 3 is a cross-sectional view illustrating an example embodiment of a portion 300 of a middle die including an annular via with recessed conductive socket 210 and a conductive pillar 310. The portion 300 may be a part of the middle die 120 of FIG. 1. The portion 300 may include the substrate 206, the conductive annular TSV 230, the UBM socket, the backside passivation 204, and the bond pad 208. In addition, the portion 300 may include a conductive, e.g., copper cylindrical pillar 310 (hereinafter also referred to as conductive pillar) formed over the planar end portion 235. In example embodiments, the conductive pillar 310 may be vertical with respect to a plane of the substrate. The conductive pillar 310 may be sized to fit into the UBM socket, therefore enabling conductive coupling between the bottom die 110 and middle die 120 when stacked by positioning the conductive pillar in the UBM socket. In an example embodiment, the conductive pillar 310 may be aligned with the recessed conductive socket 210.

Figure 4:
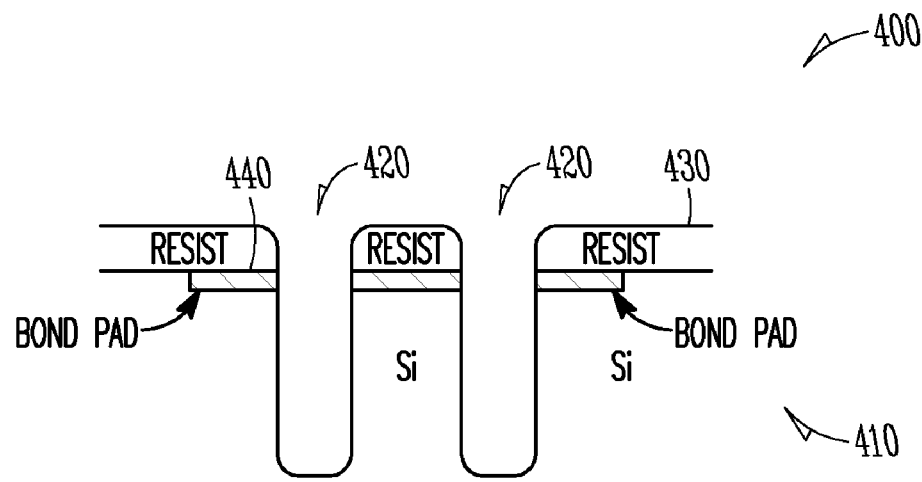
FIG. 4 is a cross sectional view illustrating an example embodiment of an in-process die after formation of an annular opening.

FIG. 4 is a cross-sectional view illustrating an example embodiment of an in-process die 400 after formation of annular opening 420. In example embodiments, an annular opening 420 may be formed by removing (e.g., etching, using dry etch, wet etch, etc.) the substrate material e.g., silicon, from a ring shape area of the substrate. The ring shape area may be patterned using (see a ring shape area 520 in FIG. 5) a photo-resist layer 430 that was coated over the top surface of the substrate 410 including the bond pad layer 440. Lithography may be used to pattern the photo resist with a ring shape opening. The photo resist may serve as a temporary etch mask during the TSV etch process. The bond pad layer 440 may have been formed by plating a conductive material, e.g., copper, on the substrate 410. The TSV etching of the substrate may form the annular opening 420 with a typical depth of approximately 50-150 microns.

Figure 5:
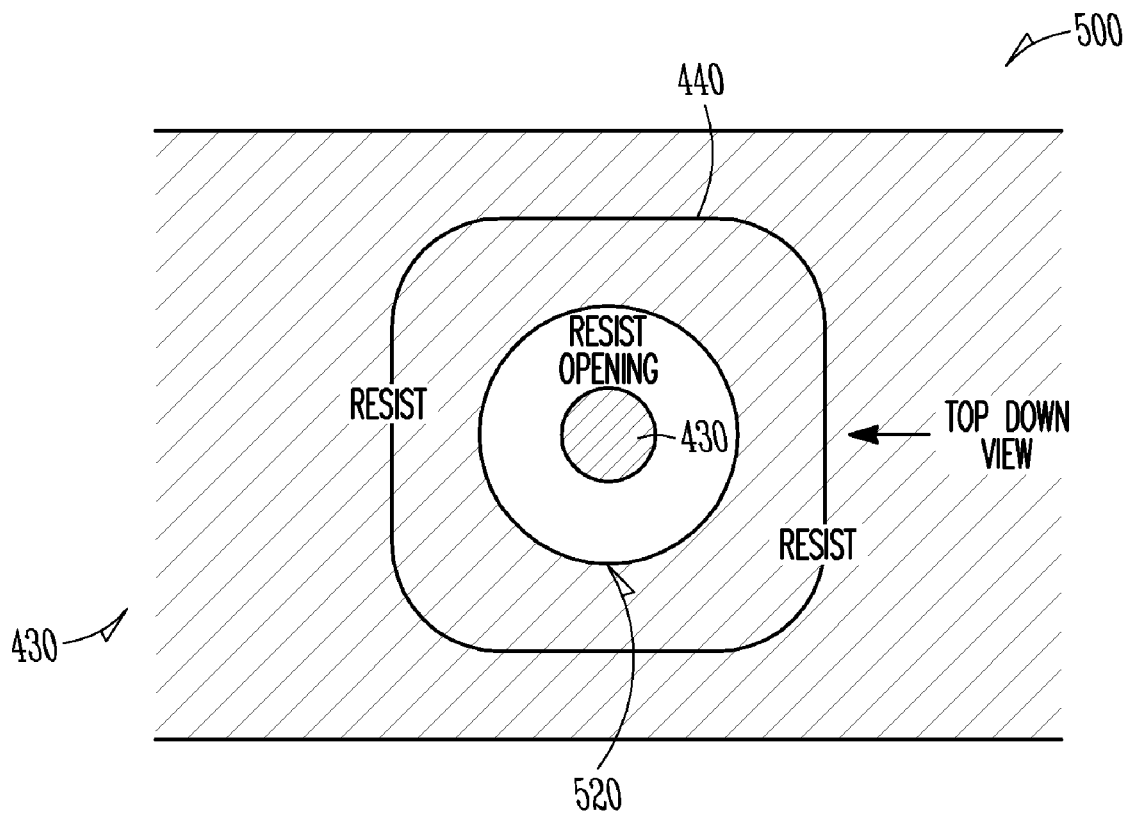
FIG. 5 is a top view of the in-process die of FIG. 4.

A top view of the in-process die of FIG. 4 is depicted in FIG. 5, where the photo-resist layer 430 covering the top surface of the substrate 410 is shown. Also shown in FIG. 5 is the ring shape area 520 clear of the photo-resist layer 430.

Figure 6:
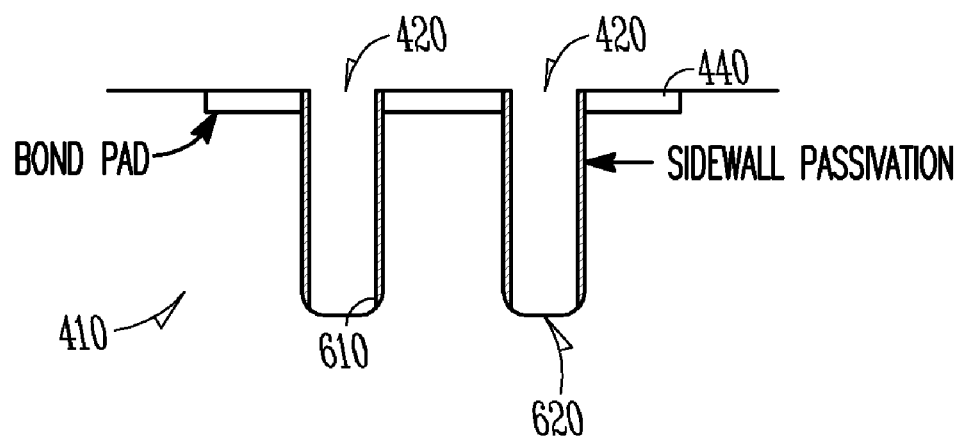
FIG. 6 is a cross sectional view of the in-process die of FIG. 4 after formation of a passivation layer over the sidewalls of the annular opening.

FIG. 6 is a cross sectional view of the in-process die of FIG. 4 after formation of a passivation layer 610 over the sidewalls of the annular opening 420. According to example embodiments, the passivation layer 610 may be formed by depositing a passivation material, e.g., aluminum oxide, using, for example, a pulse deposition layer (PDL) process, over the surface of the annular opening (sidewalls and the bottom area 620). In a next step, the passivation layer 610 may be removed from all horizontal surfaces. The removal of the passivation layer 610 from the bottom area 620 and top surface may be performed by, for example, a spacer etch, which may remove the depositions, preferentially, from horizontal surfaces.

Figure 7:
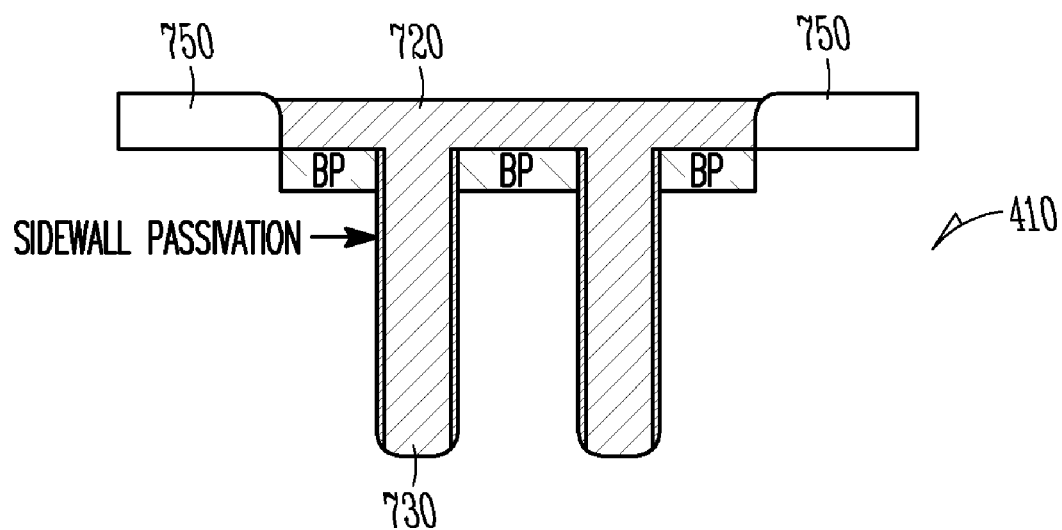
FIG. 7 is a cross sectional view of the in-process die of FIG. 6 after formation of a conductive via and the planar end portion.

The annular opening may be filled with a conductive material as shown in FIG. 7 to form a vertical portion 730 and a planar end portion 720. The sidewall passivation layer 610 may prevent current leakage from the metal via to the substrate 410 through the sidewalls during operation of the constructed package or device. In an example embodiment, the filling of the annular opening may start with a deposition of a thin seed layer of a conductive material, e.g., copper, that may facilitate the next step of forming the metal via.

The formation of the metal via may be performed by depositing, e.g., electroplating, a conductive material, e.g., copper, over a desired area. The desired area may include the surface area of the bond pad and the annular opening. The desired area may be defined through a photolithographic patterning process. The electroplated copper may form a solid metal via. After the formation of the solid metal via, the seed layer and a photo-resist layer 750 (deposited in the photolithographic patterning process) may be removed, e.g., stripped, from the surface of the substrate. In an example embodiment, a barrier layer may be deposited before formation of the seed layer. The barrier layer may prevent the electroplated copper from diffusing into the substrate. The barrier layer may also be removed from areas not covered by the electroplating process.

Figure 8:
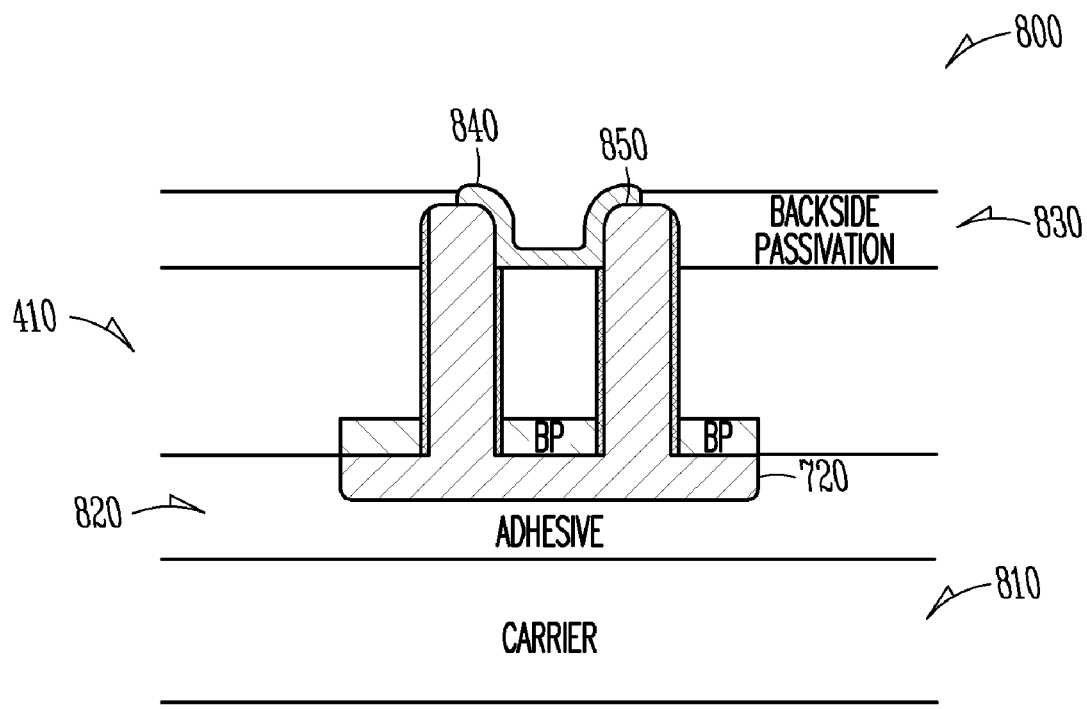
FIG. 8 is a cross sectional view of the in-process die of FIG. 7 after formation of a recessed conductive socket.

FIG. 8 is a cross sectional view of the in-process die of FIG. 7 after formation of a recessed conductive socket 840. After formation of the metal via on a top surface of the substrate, a recessed conductive socket 840 is formed on the backside surface. Achieving the recessed conductive socket 840 may involve thinning of the substrate from the back surface, opposite planar end portion 720, using, for example, a backgrinding process. To protect the substrate from any damage during the backgrinding process, a temporary carrier 810 (e.g., glass or silicon wafer) may be adhered to the top surface of the substrate using an adhesive layer 820.

The backgrinding may leave the substrate 410 with a thickness of typically 50-150 microns. The backgrinding may continue until the substrate material is substantially flush with a bottom portion of the metal via. However, to form the recessed conductive socket 840, some portions of the height of the annular metal via, e.g., 10-15 microns, have to be exposed. This may be achieved by selectively removing the substrate material, e.g., using a global wet etch or dry etch, to make the substrate material recess with respect to the metal via and form an opening surrounded by the inner side-walls of the annular metal via.

The next step before formation of the recessed conductive socket may be forming a backside passivation layer 830 over the entire recessed surface except the area where the recessed conductive socket is to be formed. This area is depicted by the numeral reference 850, where the metal via needs to be exposed (by removing the sidewall passivation of the annular TSV) in order for the recessed conductive socket 840 to be in a conductive contact with the metal via. In an example embodiment, the deposition of the backside passivation layer 830 over the selected area may be performed by using, for example, a photo-active spin-on dielectric polymer layer that may be patterned through a lithographic process.

The formation of the recessed conductive socket 840 may be performed by selectively depositing a conductive material e.g., UBM over the area not covered by the backside passivation layer 830. The processed die, at this stage, may include a TSV formed by the conductive metal via and the UBM socket (i.e., the recessed conductive socket 840) and may be used as a bottom die.

Figure 9:
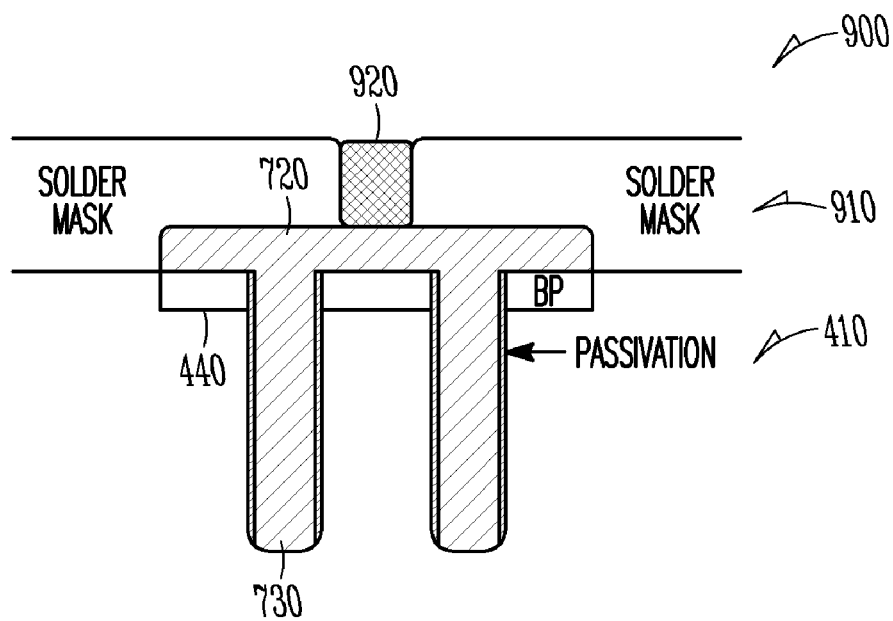
FIG. 9 is a cross sectional view of the in-process die of FIG. 8 after formation of a cylindrical conductive pillar over the planar end portion of the via.

FIG. 9 is a cross sectional view of the in-process die of FIG. 7 after formation of a cylindrical conductive pillar 920 extending out of the planar end portion of the via. A middle die 120 as shown in FIG. 1 may include a conductive pillar shown in FIG. 9 with reference numeral 920. In an example embodiment, the formation of the conductive pillar 920 may be achieved following the formation of the metal via. The process of formation of the conductive pillar 920 may start by first depositing a thick mask layer 910 over the top surface of the substrate including the planar end portion of the annular via and then, selectively removing the thick mask layer 910 from an area over which the conductive pillar 920 is to be formed. The thickness of the mask layer 910 may be equal to a height of the conductive pillar 920. The height of the conductive pillar 920 may be selected such that the conductive pillar may fit into the UBM socket 840. In an example embodiment, the conductive pillar 920 may be aligned with the metal via After selectively removing the mask layer 910 from the area considered for formation of the conductive pillar 920 (e.g., an area smaller than the area of the center portion inside the annular via), the conductive pillar 920 may be formed by selectively depositing, e.g., electroplating, a conductive layer (e.g., copper, solder material, etc.) inside a hole formed by selectively removing the mask layer 910. In a next step, the mask layer 910 may be selectively removed to expose the conductive pillar 920. Forming a middle die from the in-process die of FIG. 9 may require the processes articulated under the discussion of FIG. 8.

Figure 10:
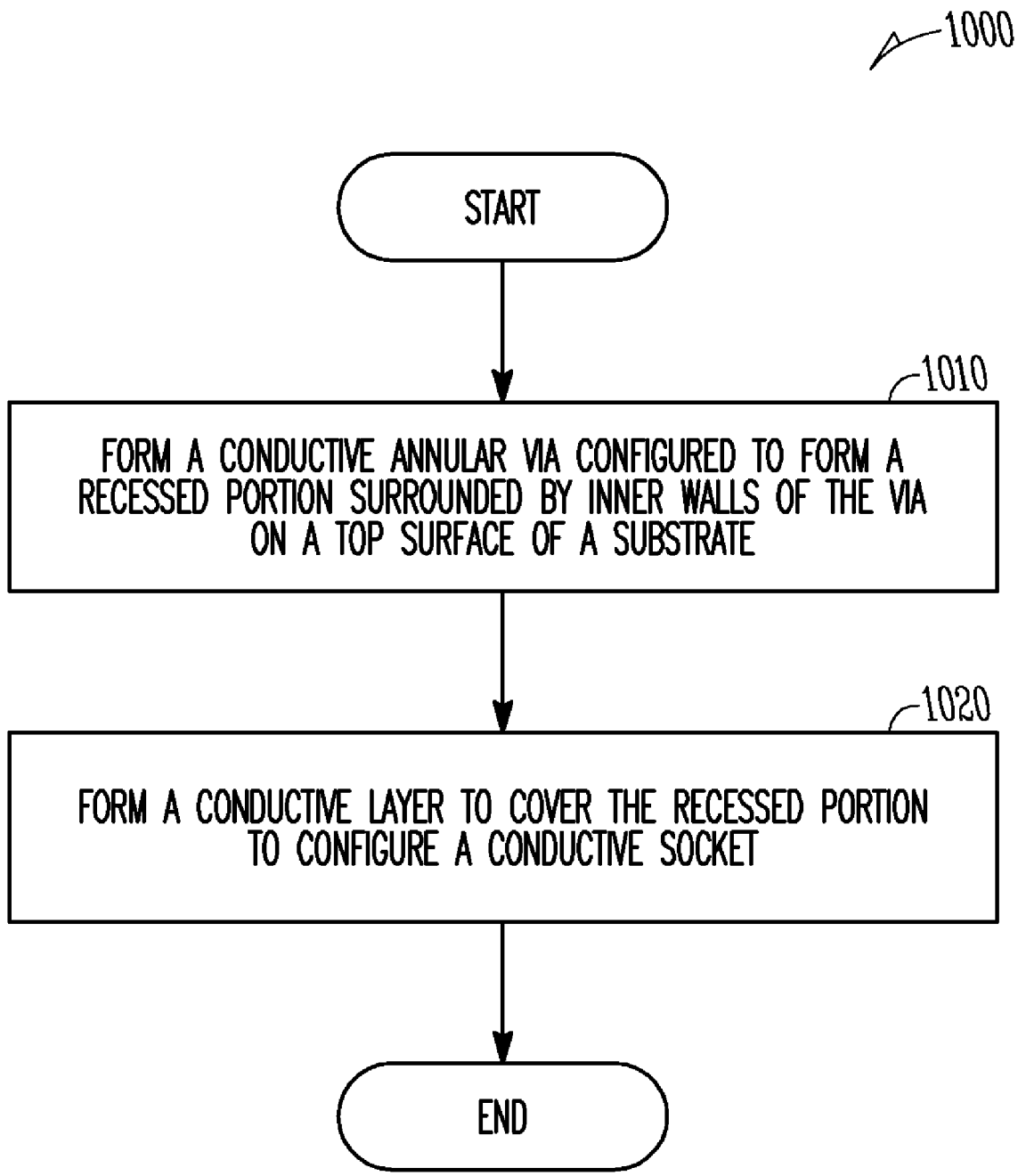
FIG. 10 is a high-level flow diagram illustrating, in an example embodiment, a method for formation of the annular via with recessed conductive socket.

FIG. 10 is a high-level flow diagram illustrating, in an example embodiment, a method 1000 for formation of the annular via with recessed conductive socket. The method 1000 starts at operation 1010, where a conductive annular via configured to form a recessed portion surrounded by inner walls of the annular via 730 may be formed on a bottom surface of a substrate 410. The method may also include forming, at operation 1020, a conductive layer to cover the recessed portion to configure a recessed conductive socket 840, as shown in FIG. 8.

Figure 11:
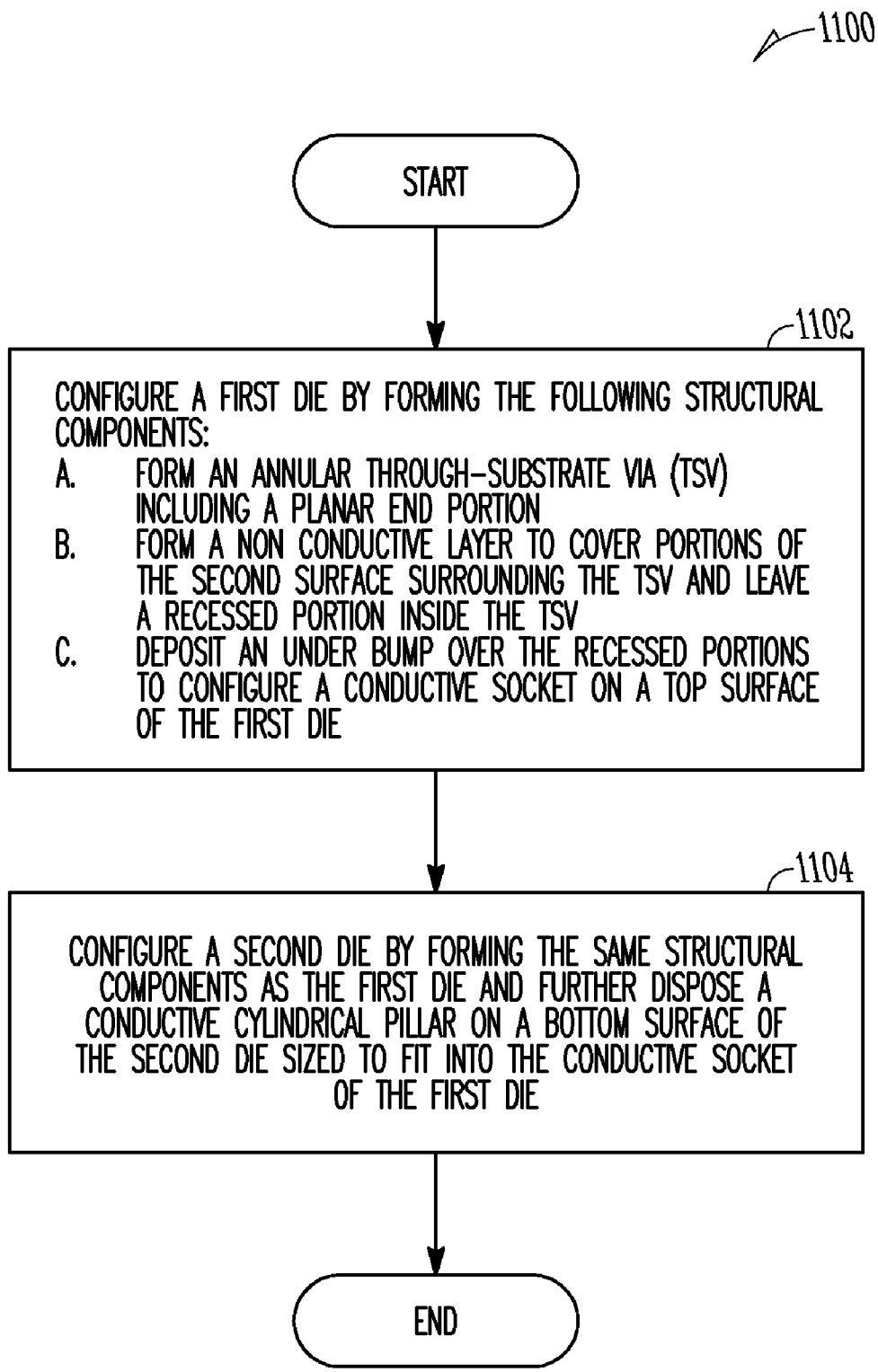
FIG. 11 is a high-level flow diagram illustrating, in an example embodiment, a method for stacking dies using annular vias with recessed conductive sockets and conductive pillars.

FIG. 11 is a high-level flow diagram illustrating, in an example embodiment, a method 1100 for stacking dies using annular vias with recessed conductive sockets and conductive pillars. The method 1100 may start at operation 1102, where a first die 110 (see FIG. 1) may be configured. The configuration may include forming structural components that includes: A. Forming an annular through substrate via (TSV) including forming a planar end portion 235 covering a portion of a first surface of a substrate 206, wherein portions of the annular TSV are extended from a second surface of the substrate 206; B. Forming a nonconductive layer (e.g., backside passivation layer 204) to cover portions of the second surface of the substrate surrounding the annular TSV and to leave a recessed portion inside the annular TSV; and C. Depositing an under bump layer 210 over the recessed portion to configure a UBM socket on a bottom surface of the first die 110, wherein the bottom surface of the first die 110 is the same as the second surface of the substrate 206.

At operation 1104, a second die, e.g., the middle die 120 of FIG. 1, may be configured. The configuration of the second die may include forming substantially the same structural components as discussed above with respect to the first die except for further disposing a conductive cylindrical pillar 310 on a top surface of the second die, extending out of the planar end potion 235. In an example embodiment, the conductive pillar 310 may be sized to fit into the recessed conductive socket formed by the UBM layer 210 of the first die.

Figure 12:
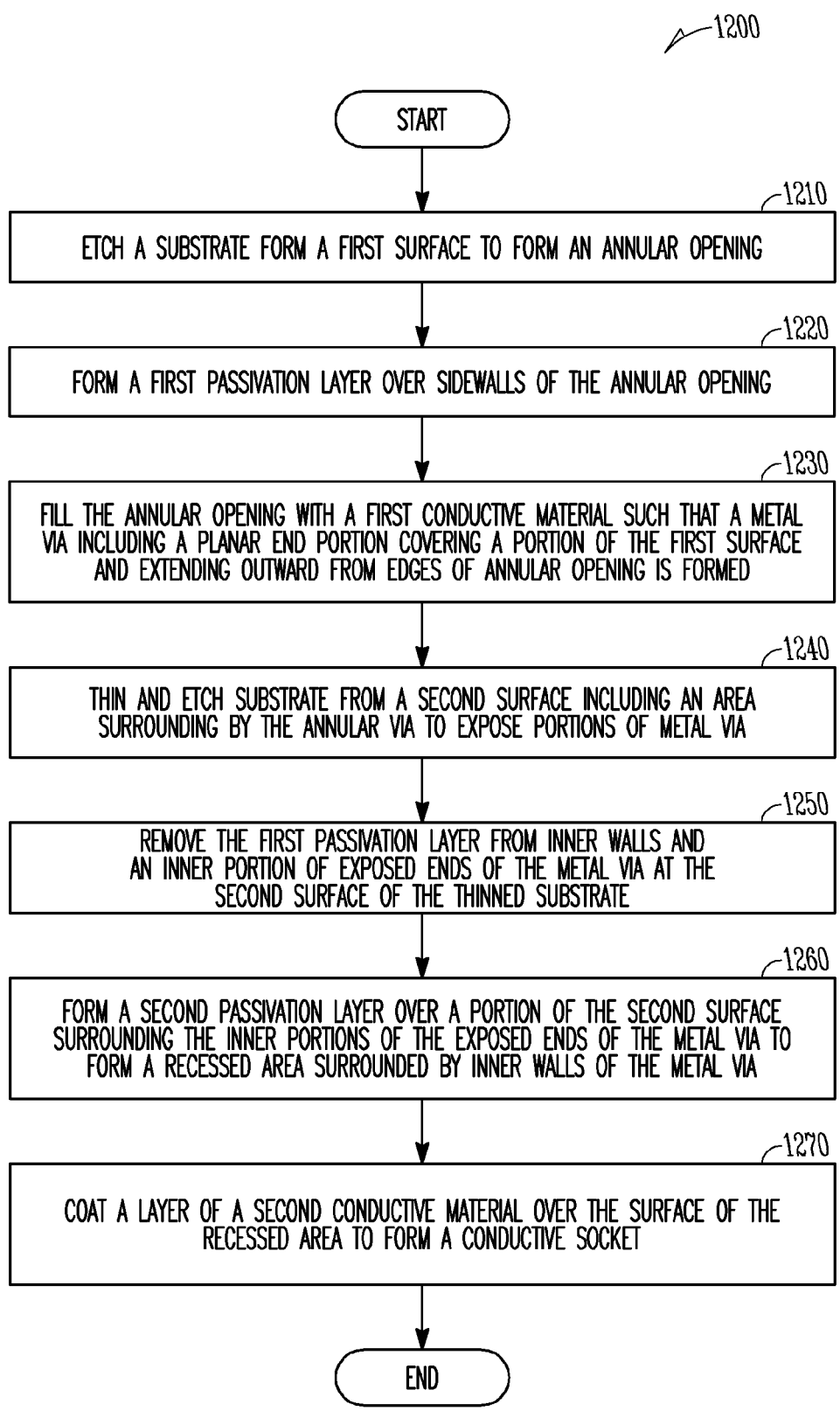
FIG. 12 is a flow diagram illustrating, in an example embodiment, a method for formation of the annular via with recessed conductive socket.

FIG. 12 is a flow diagram illustrating, in an example embodiment, a method 1200 for formation of the annular via with recessed conductive socket. The method starts at operation 1210, where the substrate 410, from a first surface of the substrate 410, is etched to form an annular opening 420. At operation 1220, a first passivation layer 610 may be deposited over sidewalls of the annular opening 420. The annular opening 420 may, at operation 1230, be filled with a first conductive material, e.g., copper, such that a metal via 730 is formed. The metal via 730 may include a planar end portion 720 covering a portion of the first surface, e.g., top side, of the substrate 410 and extending on the first surface outward from outer edges of the annular opening 420.

At operation 1240, the substrate 410 may by thinned by removing, e.g., backgrinding and etching, substrate material from a second surface of the substrate 410 including an area surrounded by the annular via 730 to an extent that a portion of the metal via 730 extends out from the second surface of the substrate 410. The first passivation layer 610 may be removed, e.g., etched away, from inner walls and an inner portion 850 of exposed ends of the metal via (operation 1250). At operation 1260, a second passivation layer 830 may be deposited over a portion of the second surface of the substrate 410 surrounding the inner portion of the exposed ends of the metal via 730 such that a recessed area surrounded by inner walls of the metal via 730 may be formed. At operation 1270, a layer of a second conductive material, e.g., UBM, may be coated over a surface of the recessed area to form a conductive UBM socket.

Figure 13:
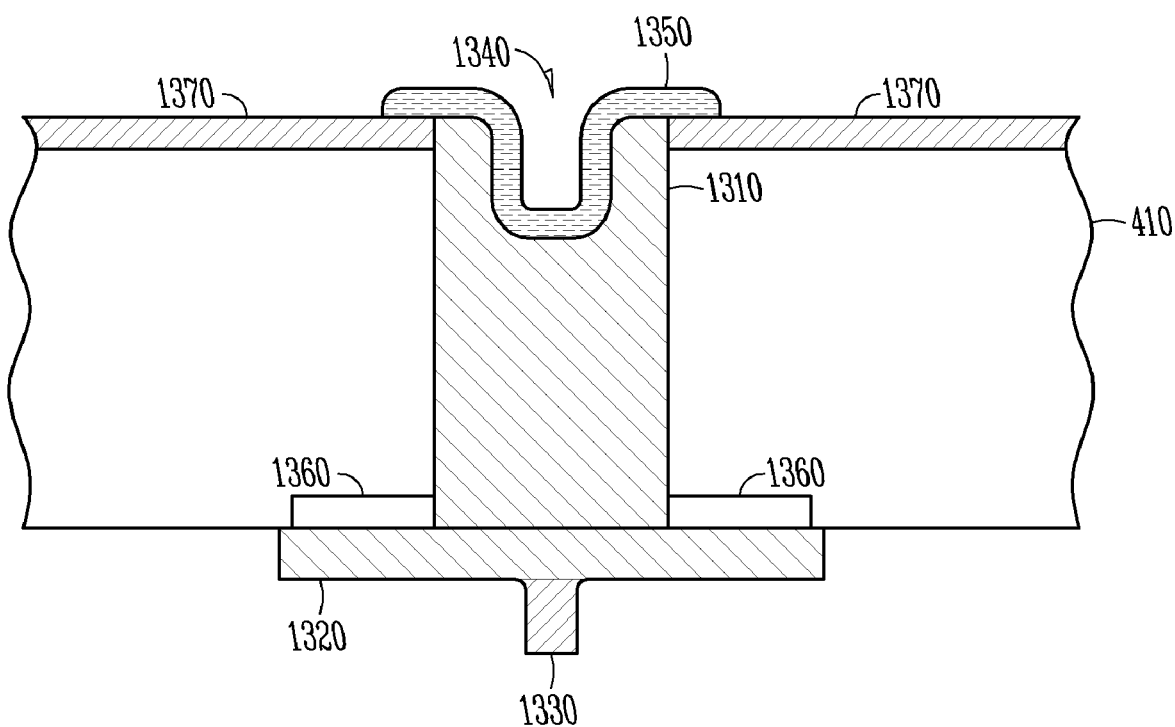
FIG. 13 a cross sectional view illustrating an example embodiment of a structure forming a portion of a die including a via with a recessed conductive socket and a cylindrical pillar.

FIG. 13 is a cross sectional view illustrating an example embodiment of a structure 1300 forming a portion of a die including a via 1310 with a recessed conductive socket 1350 and a cylindrical pillar 1330. The via 1310 may be formed as a solid cylindrical via 1310 including a planar end section 1320 in conducting contact with bond pads 1360 and a pillar 1330. The via 1310 may include a recessed portion covered by a UBM layer 1350 forming a UBM socket 1340. The backside passivation layer 1370 may be patterned and utilized to serve as the etch mask for the recessed portion into the solid cylindrical via 1310. The backside passivation layer 1370 may also be used as insulating layer. In an example embodiment, the pillar 1330 may be sized to fit into a UBM socket substantially similar to the UBM socket 1340. In example embodiments, the substrate 410 may be part of a die including electronic circuits. The electronic circuits may include DRAM, SDRAM, PCRAM, Flash memory, imagers, etc.

Figure 14:
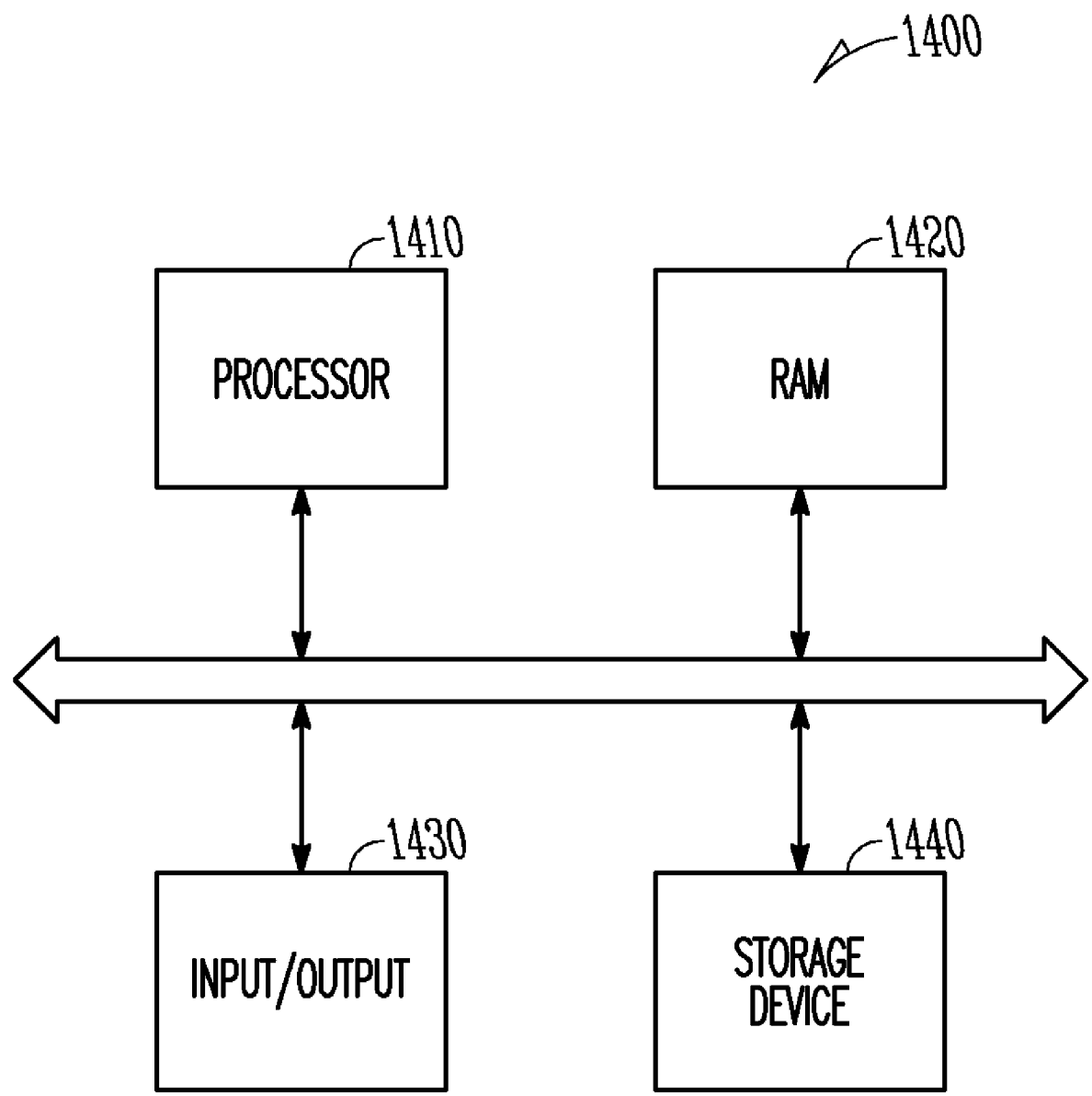
FIG. 14 is a block diagram illustrating an example embodiment of a system including electronic packages formed by the method of FIG. 11.

FIG. 14 is a block diagram illustrating an example embodiment of a system 1400 including electronic packages formed by the method of FIG. 11. According to example embodiments, the system 1400 may represent a main-frame, a desktop or a laptop computer, a personal digital assistant (PDA), a cellular phone, etc. The system 1400 may include one or more processors 1410, one or more RAM 1420, a number of input/output devices 1430, and one or more storage devices 1440 coupled to a bus 1450. In an example embodiment, the RAM 1420 may include SRAM, DRAM, PCRAM, or Flash memory. The storage device 1440 may include a hard disk, a compact disk (CD) or a digital versatile disk (DVD). In example embodiments, the processor 1410 or the RAM 1420 may include electronic packages consisting of dies stacked by way of annular vias with recessed conductive sockets as shown in FIG. 1.

A die socket structure and method for die stacking by way of annular vias with recessed conductive sockets and conductive pillars have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
    an annular through-substrate via (TSV) with a planar end portion covering a portion of a first surface of a substrate and with portions of the annular TSV exposed at a second surface of the substrate;
    a nonconductive layer covering portions of the second surface surrounding the annular TSV and leaving a recessed portion inside the annular TSV at the second surface uncovered by the nonconductive layer; and
    an under bump layer on the recessed portion forming a conductive socket on the second surface.

2. The apparatus of claim 1, further comprising a second substrate, the second substrate including a conductive cylindrical pillar, wherein the substrate with the annular TSV is a first substrate, and the conductive cylindrical pillar is fitted into the conductive socket of the first substrate.

3. The apparatus of claim 1, wherein the second substrate includes:
    a first surface and a second surface, wherein the conductive cylindrical pillar is on the second surface;
    an additional annular TSV with a planar end portion covering a portion of the first surface of the second substrate and with portions of the annular TSV exposed at the second surface of the second substrate;
    an additional nonconductive layer covering portions of the second surface of the second substrate, surrounding the additional annular TSV and leaving an additional recessed portion inside the additional annular TSV at the second surface of the second substrate uncovered by the additional nonconductive layer; and
    an additional under bump layer on the additional recessed portion forming an additional conductive socket on the second surface of the second substrate.

4. The apparatus of claim 3, further comprising a third substrate including an additional conductive cylindrical pillar fitted into the additional conductive socket of the second substrate.

5. The apparatus of claim 1, wherein the first surface is an active surface of the substrate.

6. The apparatus of claim 1, wherein the substrate is included in a die, the die including an electronic device at the first surface.

7. A method comprising:
    forming an annular through-substrate via (TSV) with a planar end portion covering a portion of a first surface of a substrate and with portions of the annular TSV exposed at a second surface of the substrate;
    forming a nonconductive layer covering portions of the second surface of the substrate surrounding the annular TSV and leaving a recessed portion inside the annular TSV at the second surface uncovered by the nonconductive layer; and
    depositing an under bump layer on the recessed portion forming a conductive socket on the second surface of the substrate.

8. The method of claim 7, further comprising:
    forming a conductive cylindrical pillar on a surface of a second substrate, wherein the substrate with the annular TSV is a first substrate, and the conductive cylindrical pillar is sized to fit into the conductive socket of the first substrate.

9. The method of claim 8, further comprising:
    forming a stack from the first substrate and the second substrate, such that the conductive cylindrical pillar of the second substrate is fitted into the conductive socket of the first substrate to form a conductive connection between the conductive cylindrical pillar of the second substrate and the conductive socket of the first substrate.

10. The method of claim 9, further comprising:
    disposing a third substrate over the stack of the first substrate and the second substrate, such that a metal pillar of the third substrate is disposed in a conductive socket in an annular via of the second substrate to form a conductive connection between the metal pillar and the conductive socket of the second substrate.

11. The method of claim 9, further comprising:
    disposing a conductive cylindrical pillar of at least one additional substrate in a conductive socket in an annular via of the second substrate.

12. The method of claim 7, further comprising:
    forming an additional annular TSV with a planar end portion covering a portion of a first surface of a second substrate and with portions of the additional annular TSV exposed at a second surface of the second substrate;
    forming a additional nonconductive layer covering portions of the second surface of the second substrate surrounding the additional annular TSV and leaving an additional recessed portion inside the additional annular TSV at the second surface of the second substrate uncovered by the additional nonconductive layer;
    depositing an additional under bump layer on the additional recessed portion forming an additional conductive socket on the second surface of the second substrate; and
    forming a conductive cylindrical pillar on the first surface of a second substrate.

13. The method of claim 12, further comprising:
    forming a stack from the first substrate and the second substrate, such that the conductive cylindrical pillar of the second substrate is fitted into the conductive socket of the first substrate.

14. The method of claim 13, wherein the first substrate is included in a first die, the second substrate is included in a second die, and at least one of the first and second die includes an electronic device.

* * * * *